US011159141B2

United States Patent
Yamamoto et al.

(10) Patent No.: US 11,159,141 B2
(45) Date of Patent: Oct. 26, 2021

(54) ACOUSTIC WAVE DEVICE, RADIO-FREQUENCY FRONT-END CIRCUIT, AND COMMUNICATION APPARATUS

(71) Applicant: Murata Manufacturing Co., Ltd., Nagaokakyo (JP)

(72) Inventors: Koji Yamamoto, Nagaokakyo (JP); Tsutomu Takai, Nagaokakyo (JP); Hideaki Takahashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 35 days.

(21) Appl. No.: 16/707,155

(22) Filed: Dec. 9, 2019

(65) Prior Publication Data

US 2020/0186119 A1 Jun. 11, 2020

(30) Foreign Application Priority Data

Dec. 10, 2018 (JP) .............................. JP2018-230787

(51) Int. Cl.
| | | |
|---|---|---|
| H03H 9/02 | (2006.01) | |
| H03H 9/145 | (2006.01) | |
| H03F 3/21 | (2006.01) | |
| H04B 1/04 | (2006.01) | |
| H03H 9/25 | (2006.01) | |

(52) U.S. Cl.
CPC ......... *H03H 9/02937* (2013.01); *H03F 3/211* (2013.01); *H03H 9/02637* (2013.01);
(Continued)

(58) Field of Classification Search
CPC ........... H03H 9/02937; H03H 9/02637; H03H 9/02834; H03H 9/02866; H03H 9/02992;
(Continued)

(56) References Cited

U.S. PATENT DOCUMENTS

2009/0152993 A1* 6/2009 Kando ............... H03H 9/02834
310/346
2013/0285768 A1 10/2013 Watanabe et al.
(Continued)

FOREIGN PATENT DOCUMENTS

| WO | 2012/086639 A1 | 6/2012 |
| WO | 2017/043427 A1 | 3/2017 |
| WO | 2018/105249 A1 | 6/2018 |

OTHER PUBLICATIONS

Lee et al. "Propagation Characteristics of Surface Acoustic Waves in AlN/128°Y-X LiNbO3 Structures", published in Japanese Journal of Applied Physics, Apr. 20, 2009, pp. 1-5 (Year: 2009).*
(Continued)

*Primary Examiner* — Hafizur Rahman

(74) *Attorney, Agent, or Firm* — Keating & Bennett, LLP

(57) ABSTRACT

An acoustic wave device includes a high-acoustic-velocity film, a piezoelectric layer provided directly or indirectly on the high-acoustic-velocity film, an IDT electrode provided on the piezoelectric layer, and a dielectric film provided on the piezoelectric layer to cover the IDT electrode. An acoustic velocity of bulk waves propagating through the high-acoustic-velocity film is higher than an acoustic velocity of acoustic waves propagating through the piezoelectric layer. The dielectric film includes a material including hydrogen atoms.

14 Claims, 3 Drawing Sheets

(52) U.S. Cl.
CPC .... *H03H 9/02834* (2013.01); *H03H 9/02866* (2013.01); *H03H 9/02992* (2013.01); *H03H 9/14541* (2013.01); *H03H 9/25* (2013.01); *H04B 1/04* (2013.01); *H03F 2200/165* (2013.01); *H03F 2200/294* (2013.01); *H03F 2200/451* (2013.01); *H04B 2001/0408* (2013.01)

(58) Field of Classification Search
CPC ...... H03H 9/14541; H03H 9/25; H03F 3/211; H03F 2200/165; H03F 2200/294; H03F 2200/451; H04B 1/04; H04B 2001/0408
USPC .................................................. 333/150, 195
See application file for complete search history.

(56) References Cited

U.S. PATENT DOCUMENTS

| | | |
|---|---|---|
| 2018/0159497 A1 | 6/2018 | Iwamoto et al. |
| 2019/0288668 A1 | 9/2019 | Takahashi et al. |
| 2020/0021272 A1* | 1/2020 | Segovia Fernandez .................... H03B 5/364 |
| 2020/0067480 A1* | 2/2020 | Tai ....................... H03H 9/0585 |

OTHER PUBLICATIONS

Larson III et al. "Attenuation and Velocity Measurement at GHz Frequencies in Thin Film Carbon Doped Silicon Oxide", published in 2010 IEEE International Ultrasonics Symposium Proceedings, pp. 394-399 (Year: 2010).*

NDT resource center, UT Materials Properties Tables, p. 4 of 5 (Year: 2014).*

J.-F. Lelièvre, E. Fourmond, A. Kaminski, Olivier Palais, D. Ballutaud, et al.. Study of the composition of hydrogenated silicon nitride SiNx:H for efficient surface and bulk passivation of silicon. Solar Energy Materials and Solar Cells, Elsevier, 2009, 93 (8), pp. 1281-1289. (Year: 2009).*

Marathe, R., "Active Sensing in Silicon-based MEMS Resonators", MIT, Jun. 2015 (Year: 2015).*

* cited by examiner

ACOUSTIC WAVE DEVICE, RADIO-FREQUENCY FRONT-END CIRCUIT, AND COMMUNICATION APPARATUS

CROSS REFERENCE TO RELATED APPLICATIONS

This application claims the benefit of priority to Japanese Patent Application No. 2018-230787 filed on Dec. 10, 2018. The entire contents of this application are hereby incorporated herein by reference.

BACKGROUND

1. Technical Field

The disclosure relates to an acoustic wave device, a radio-frequency (RF) front-end circuit, and a communication apparatus.

2. Description of the Related Art

Acoustic wave devices have been widely used in filters of cellular phones. International Publication No. 2017/043427 discloses an example of an acoustic wave device. This acoustic wave device includes a multilayer body in which a high-acoustic-velocity supporting substrate, a low-acoustic-velocity film, and a piezoelectric film are laminated in this order, and an interdigital transducer (IDT) electrode provided on the piezoelectric film. A dielectric film is provided on the piezoelectric film to cover the IDT electrode. The dielectric film has the function as a protective film for protecting the IDT electrode. The acoustic wave device with the above-described multilayer body has a high Q value because the energy of acoustic waves is concentrated on the piezoelectric film side.

However, as in the acoustic wave device described in International Publication No. 2017/043427, when the dielectric film covering the IDT electrode is provided on the piezoelectric film, the dielectric film absorbs moisture, which may cause the weight of the dielectric film to vary. When the acoustic wave device has the above-described multilayer body including the high-acoustic-velocity supporting substrate and the piezoelectric film, and the energy of acoustic waves is concentrated on the piezoelectric film side, variations of the weight of the dielectric film particularly have a great influence on acoustic waves. More specifically, the acoustic velocity of acoustic waves varies due to variations of the weight of the dielectric film, causing the frequency of the acoustic waves to vary. Therefore, desired filter characteristics may not be stably obtained by the acoustic wave device with the above-described multilayer body.

SUMMARY OF THE INVENTION

Preferred embodiments of the present invention provide acoustic wave devices, RF front-end circuits, and communication apparatuses in which an IDT electrode may not be easily damaged, the Q value may be increased, and variations of the frequency may be significantly reduced or prevented.

An acoustic wave device according to a preferred embodiment of the present invention includes a high-acoustic-velocity material layer, a piezoelectric layer provided directly or indirectly on the high-acoustic-velocity material layer, an interdigital transducer (IDT) electrode provided on the piezoelectric layer, and a dielectric film provided on the piezoelectric layer to cover the IDT electrode. An acoustic velocity of bulk waves propagating through the high-acoustic-velocity material layer is higher than an acoustic velocity of acoustic waves propagating through the piezoelectric layer. The dielectric film is made of a material including hydrogen atoms.

According to a preferred embodiment of the present invention, a radio-frequency (RF) front-end circuit includes an acoustic wave device according to a preferred embodiment of the present invention, and a power amplifier.

According to a preferred embodiment of the present invention, a communication apparatus includes a radio-frequency (RF) front-end circuit according to a preferred embodiment of the present invention, and an RF signal processing circuit.

According to preferred embodiments of the present invention, acoustic wave devices, RF front-end circuits, and communication apparatuses are provided in which an IDT electrode may not be easily damaged, the Q value may be increased, and variations of the frequency may be significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing specific preferred embodiments of the present invention with reference to the drawings.

Note that the preferred embodiments described in the present specification are exemplary, and it is noted that a partial replacement or combination of configurations in different preferred embodiments is possible.

Figure 1:
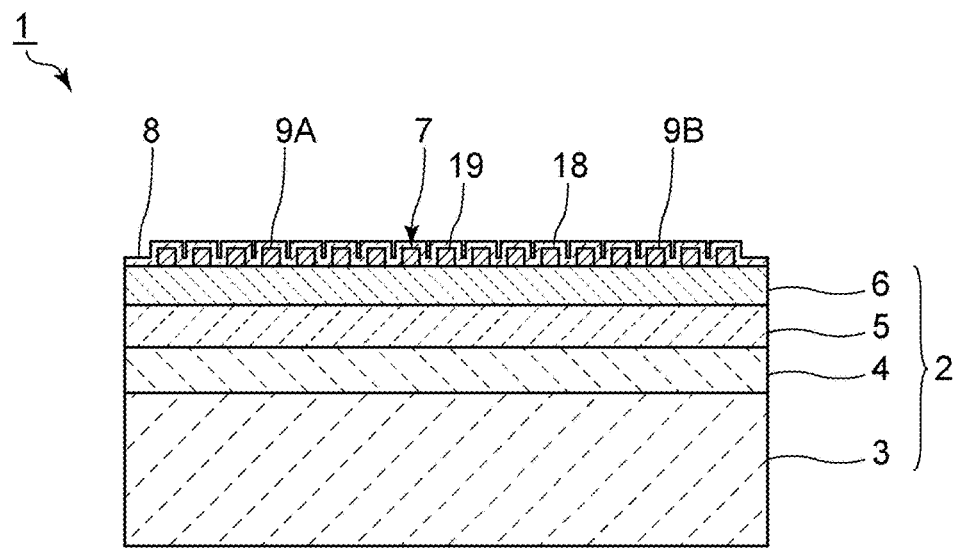
FIG. 1 is an elevational cross-sectional view of an acoustic wave device according to a first preferred embodiment of the present invention.

FIG. 1 is an elevational cross-sectional view of an acoustic wave device according to a first preferred embodiment of the present invention.

An acoustic wave device 1 includes a piezoelectric substrate 2. An IDT electrode 7 is provided on the piezoelectric substrate 2. Acoustic waves are excited in response to application of an alternating-current (AC) voltage to the IDT electrode 7. A pair of reflectors 9A and 9B are provided at two sides in an acoustic wave propagating direction of the IDT electrode 7 on the piezoelectric substrate 2. As described here, the acoustic wave device 1 of the first preferred embodiment is preferably an acoustic wave resonator. An acoustic wave device according to the present invention may be a filter device including an acoustic wave resonator.

A dielectric film 8 is provided on the piezoelectric substrate 2 to cover the IDT electrode 7. The dielectric film 8 is preferably made of a material whose main component is silicon oxide and which also includes hydrogen atoms, for example. Silicon oxide is represented by $SiO_x$, and x is an arbitrary positive number. In the first preferred embodiment, the main component of the dielectric film 8 is preferably, for example, $SiO_2$. In the dielectric film 8, hydrogen atoms exist as, for example, a silanol group or a hydroxyl group. The hydrogen atom concentration of the dielectric film 8 is preferably about $1.49 \times 10^{21}$ atoms/cm$^3$ or greater, for example. Note that the main component of the dielectric film 8 may be dielectrics other than silicon oxide. In the present specification, the main component refers to a component included in an amount of about 50% by weight or more.

The dielectric film 8 is formed by doping dielectrics with water ($H_2O$). More specifically, the dielectric film 8 may be formed by, for example, sputtering. While a film is being formed by sputtering, water is vaporized by a vaporizer and mixed with a sputtering gas, thus doping dielectrics with hydrogen atoms as a silanol group or the like.

When the dielectric film 8 is formed by doping dielectrics with water, the hydrogen atom concentration of the dielectric film 8 is preferably about $1.49 \times 10^{21}$ atoms/cm$^3$ or greater, for example, as in the first preferred embodiment.

The piezoelectric substrate 2 includes a supporting substrate 3, a high-acoustic-velocity film 4 defining and functioning as a high-acoustic-velocity material layer provided on the supporting substrate 3, a low-acoustic-velocity film 5 provided on the high-acoustic-velocity film 4, and a piezoelectric layer 6 provided on the low-acoustic-velocity film 5. The IDT electrode 7 is provided on the piezoelectric layer 6. Note that the configuration of the piezoelectric substrate 2 is not limited to the above.

As the material of the piezoelectric layer 6, for example, piezoelectric single quartz such as lithium niobate or lithium tantalate, or piezoelectric ceramics such as zinc oxide or aluminum nitride may preferably be used.

The low-acoustic-velocity film 5 is a film where the acoustic velocity is relatively low. More specifically, the acoustic velocity of bulk waves propagating through the low-acoustic-velocity film 5 is lower than the acoustic velocity of bulk waves propagating through the piezoelectric layer 6.

The main component of the low-acoustic-velocity film 5 is silicon oxide, for example. More specifically, the main component of the low-acoustic-velocity film 5 is preferably, for example, $SiO_2$. In the first preferred embodiment, the low-acoustic-velocity film 5 includes almost no hydrogen atoms. Therefore, the hydrogen atom concentration of the dielectric film is higher than the hydrogen atom concentration of the low-acoustic-velocity film 5.

Note that the material of the low-acoustic-velocity film 5 is not limited to the above, and a medium including the above material as the main component, for example, glass, silicon oxynitride, tantalum oxide, or a compound obtained by adding fluorine, carbon, or boron to silicon oxide may also be used.

In the first preferred embodiment, the high-acoustic-velocity material layer is the high-acoustic-velocity film 4. The high-acoustic-velocity material layer is a layer where the acoustic velocity is relatively high. More specifically, the acoustic velocity of bulk waves propagating through the high-acoustic-velocity material layer is higher than the acoustic velocity of acoustic waves propagating through the piezoelectric layer 6. As the material of the high-acoustic-velocity film 4, for example, a medium including the above material as the main component, for example, aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, diamond-like carbon (DLC) film, or diamond may be used.

As the material of the supporting substrate 3, for example, piezoelectric materials such as aluminum oxide, lithium tantalate, lithium niobate, and quartz, various ceramics such as alumina, magnesia, silicon nitride, aluminum nitride, silicon carbide, zirconia, cordierite, mullite, steatite, and forsterite, dielectrics such as sapphire, diamond, and glass, semiconductor such as silicon and gallium nitride, or resin may be used.

Figure 2:
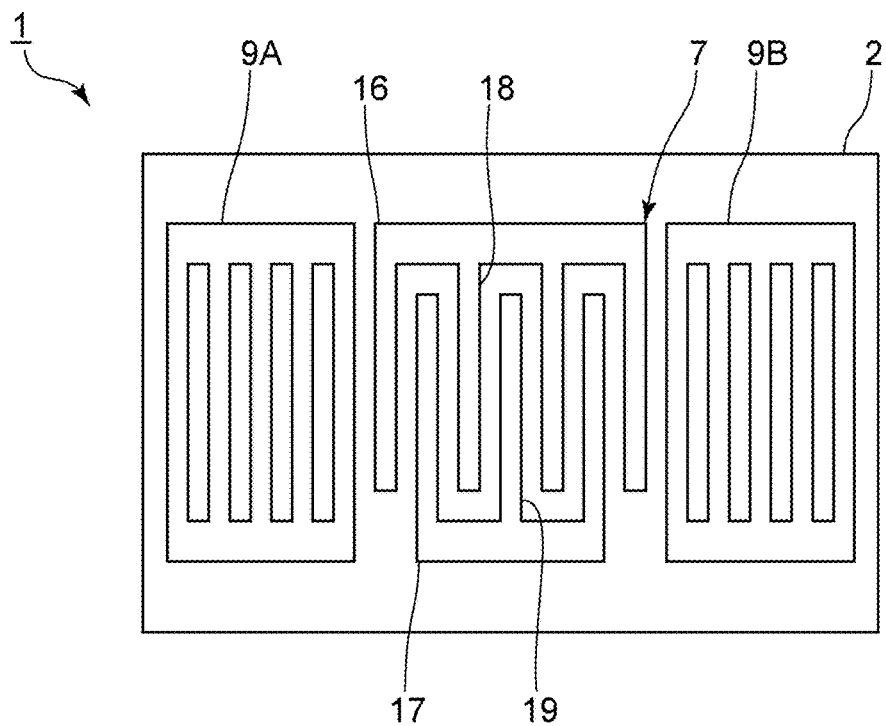
FIG. 2 is an enlarged plan view showing a portion near electrode fingers of an IDT electrode in the first preferred embodiment of the present invention.

FIG. 2 is an enlarged plan view showing a portion near electrode fingers of the IDT electrode in the first preferred embodiment.

The IDT electrode 7 includes a first busbar 16 and a second busbar 17 facing each other. The IDT electrode 7 includes a plurality of first electrode fingers 18 whose first ends are connected to the first busbar 16. The IDT electrode 7 further includes a plurality of second electrode fingers 19 whose first ends are connected to the second busbar 17. The plurality of first electrode fingers 18 and the plurality of second electrode fingers 19 interdigitate with each other.

The IDT electrode 7, the reflector 9A, and the reflector 9B may be made of a multi-metal layer made by laminating a plurality of metal layers, or may be made of a single metal layer.

Referring back to FIG. 1, the acoustic wave device 1 of the first preferred embodiment includes the high-acoustic-velocity film 4 defining and functioning as the high-acoustic-velocity material layer, the piezoelectric layer 6 provided directly or indirectly on the high-acoustic-velocity film 4, the IDT electrode 7 provided on the piezoelectric layer 6, and the dielectric film 8 provided on the piezoelectric layer 6 to cover the IDT electrode 7. The acoustic wave device 1 has a configuration in which the acoustic velocity of bulk waves propagating through the high-acoustic-velocity film 4 is higher than the acoustic velocity of acoustic waves propagating through the piezoelectric layer 6, and the dielectric film 8 includes a material including hydrogen atoms. Accordingly, the IDT electrode 7 may not be easily damaged, the Q value may be high, and variations of the frequency may be significantly reduced or prevented. This will be described hereinafter.

In the first preferred embodiment, the IDT electrode 7 is not easily damaged because the IDT electrode 7 is covered with and protected by the dielectric film 8. Furthermore, the piezoelectric substrate 2 of the acoustic wave device 1 has a configuration in which the high-acoustic-velocity film 4, the low-acoustic-velocity film 5, and the piezoelectric layer 6 are laminated in this order. Accordingly, the energy of acoustic waves are substantially confined on the piezoelectric layer 6 side, thus increasing the Q value.

In addition, because the dielectric film 8 is made or a material including hydrogen atoms, mixing of moisture in the dielectric film 8 may be significantly reduced or prevented, thus significantly reducing or preventing variations of the weight of the dielectric film 8. Accordingly, even when the energy of acoustic waves is concentrated on the piezoelectric layer 6 side, as in the first preferred embodiment, variations of the acoustic velocity of acoustic waves may be significantly reduced or prevented. Here, when V denotes the acoustic velocity, f denotes the frequency, and λ denotes the wavelength of acoustic waves, then, the relationship f=V/λ holds true. The wavelength λ is defined by the pitch of electrode fingers of the IDT electrode 7. Furthermore, because variations of the acoustic velocity V may be significantly reduced or prevented in the first preferred embodiment, variations of the frequency f may be significantly reduced or prevented. Accordingly, variations of the frequency f may be significantly reduced or prevented while providing the advantageous effects that the IDT electrode 7 may not be easily damaged and the Q value may be increased.

The advantageous effect that variations of the frequency may be significantly reduced or prevented will be described hereinafter by comparing the first preferred embodiment and a comparative example.

An acoustic wave device according to the first preferred embodiment, and an acoustic wave device of a comparative example were made. In the first preferred embodiment, a dielectric film was formed by doping dielectrics with water. In contrast, in the comparative example, a dielectric film was formed without doping dielectrics with water.

Next, the frequency of each of the above-described acoustic wave devices before being placed in a hot and humid environment was measured. Next, each of the above-described acoustic wave devices was placed in a hot and humid environment at about 130° C. and a relative humidity (RH) of about 85% for about 96 hours. After that, the frequency of each of the above-described acoustic wave devices was measured. Furthermore, a frequency variation amount which is the difference in frequency before and after being placed in the above environment was calculated.

The frequency variation amount in the comparative example was about −1.2 MHz. In contrast, the frequency variation amount in the first preferred embodiment was about −0.6 MHz. It is clear from the above comparison that, even when the acoustic wave device of the first preferred embodiment is placed in a hot and humid environment, variations of the frequency may be more reliably and significantly reduced or prevented.

Because it is difficult to prevent mixing of moisture in the dielectric film in the comparative example, it is difficult to reduce or prevent variations of the weight of the dielectric film. Therefore, it is also difficult to reduce or prevent variations of the acoustic velocity of acoustic waves and variations of the frequency. In contrast, in the first preferred embodiment shown in FIG. 1, because the dielectric film 8 is made of a material including hydrogen atoms and mixing of moisture may be significantly reduced or prevented, the weight of the dielectric film 8 does not vary easily. Thus, the acoustic velocity of acoustic waves does not vary easily, thus significantly reducing or preventing variations of the frequency.

In addition, because variations of the frequency may be significantly reduced or prevented in the first preferred embodiment, the degree of freedom in design may be improved. Accordingly, the filter characteristics of the acoustic wave device 1 may be more reliably improved.

Preferably, for example, the hydrogen atom concentration of the dielectric film 8 is greater than or equal to about $1.49 \times 10^{21}$ atoms/cm$^3$, as in the first preferred embodiment. In this case, mixing of moisture in the dielectric film 8 may be further significantly reduced or prevented. Accordingly, it is more difficult for the weight of the dielectric film 8 to vary. Thus, it is more difficult for the acoustic velocity of acoustic waves to vary, thereby further significantly reduced or prevented variations of the frequency.

Preferably, for example, the main component of the dielectric film 8 and the low-acoustic-velocity film 5 are silicon oxide. Accordingly, the absolute value of the temperature coefficient of frequency (TCF) may be reduced. Accordingly, variations of the frequency in response to temperature changes may also be significantly reduced or prevented.

For example, a bonding layer including titanium oxide may be provided in the low-acoustic-velocity film 5. The bonding layer is provided in forming the piezoelectric substrate 2. Note that the bonding layer need not be provided.

As described above, the piezoelectric substrate 2 is a multilayer body including the supporting substrate 3, the high-acoustic-velocity film 4, the low-acoustic-velocity film 5, and the piezoelectric layer 6. The piezoelectric layer 6 is indirectly provided, with the low-acoustic-velocity film 5 located therebetween, on the high-acoustic-velocity film 4 defining and functioning as the high-acoustic-velocity material layer. The configuration of the piezoelectric substrate 2 is not limited to the above. Hereinafter, a first modification and a second modification of the first preferred embodiment, which are different from the first preferred embodiment only in the configuration of the piezoelectric substrate, will be described. In the first modification and the second modification, as in the first preferred embodiment, the IDT electrode may not be easily damaged, the Q value may be high, and variations of the frequency may be significantly reduced or prevented.

Figure 3:
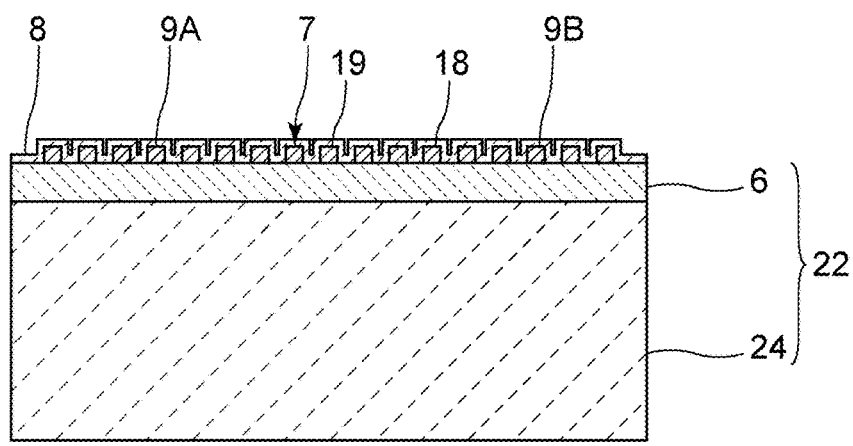
FIG. 3 is an elevational cross-sectional view of an acoustic wave device according to a first modification of the first preferred embodiment of the present invention.

In the first modification shown in FIG. 3, the high-acoustic-velocity material layer is a high-acoustic-velocity supporting substrate 24. A piezoelectric substrate 22 includes the high-acoustic-velocity supporting substrate 24, and the piezoelectric layer 6 provided on the high-acoustic-velocity supporting substrate 24. As described here, the piezoelectric layer 6 is provided directly on the high-acoustic-velocity supporting substrate 24 defining and functioning as the high-acoustic-velocity material layer.

As the material of the high-acoustic-velocity supporting substrate 24, for example, a medium including the above material as the main component, such as aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, DLC film, or diamond may be used.

Figure 4:
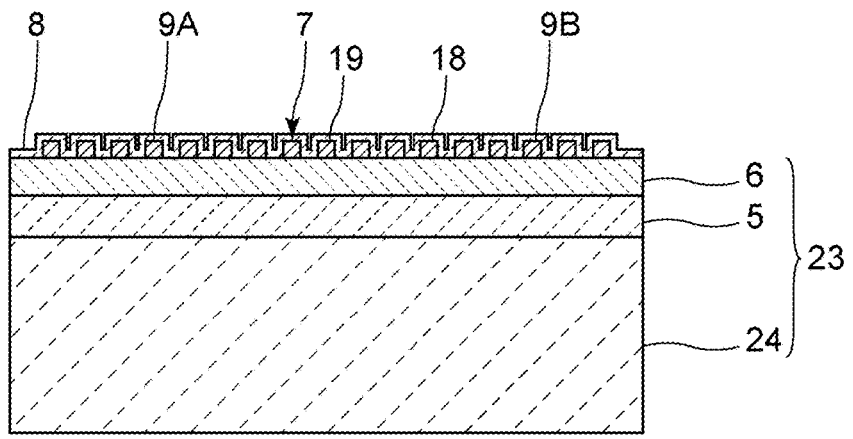
FIG. 4 is an elevational cross-sectional view of an acoustic wave device according to a second modification of the first preferred embodiment of the present invention.

In the second modification shown in FIG. 4, a piezoelectric substrate 23 includes the high-acoustic-velocity supporting substrate 24, the low-acoustic-velocity film 5 provided on the high-acoustic-velocity supporting substrate 24, and the piezoelectric layer 6 provided on the low-acoustic-velocity film 5.

Figure 5:
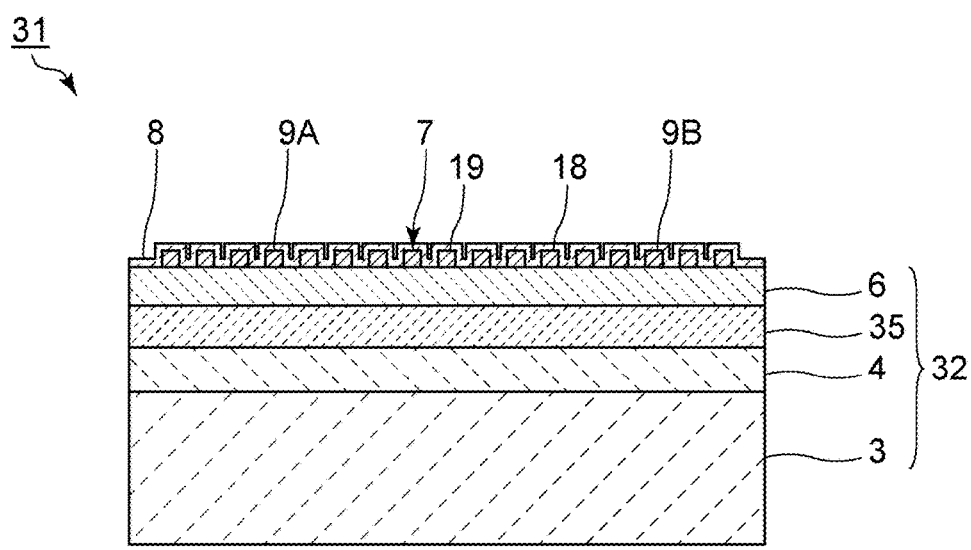
FIG. 5 is a front elevational cross-sectional view of an acoustic wave device according to a second preferred embodiment of the present invention.

FIG. 5 is an elevational cross-sectional view of an acoustic wave device according to a second preferred embodiment of the present invention.

The second preferred embodiment is different from the first preferred embodiment in that a low-acoustic-velocity film 35 is preferably made of a material including hydrogen atoms, for example. The main component of the low-acoustic-velocity film 35 is preferably, for example, SiO$_2$. In the low-acoustic-velocity film 35, hydrogen atoms exist as, for example, a silanol group or a hydroxyl group. An acoustic wave device 31 of the second preferred embodiment has the same or substantially the same configuration as that of the acoustic wave device 1 of the first preferred embodiment except for the above-described point. Note that, also in the second preferred embodiment, the hydrogen atom concentration of the dielectric film 8 is higher than the hydrogen atom concentration of the low-acoustic-velocity film 35.

As in the first preferred embodiment, the acoustic wave device 31 includes the dielectric film 8 provided to cover the IDT electrode 7. A piezoelectric substrate 32 of the acoustic wave device 31 has a configuration in which the high-acoustic-velocity film 4, the low-acoustic-velocity film 35, and the piezoelectric layer 6 are laminated in this order. This makes it difficult for the IDT electrode 7 to be damaged, and increases the Q value.

In addition, because the hydrogen atom concentration of the dielectric film 8 is higher than the hydrogen atom concentration of the low-acoustic-velocity film 35, the hydrogen atom concentration of the dielectric film 8 is sufficiently high. Accordingly, mixing of moisture in the dielectric film 8 may be significantly reduced or prevented, thus making it difficult for the weight of the dielectric film 8 to vary. Therefore, the acoustic velocity of acoustic waves becomes difficult to vary, thus significantly reducing or preventing variations of the frequency.

Preferably, for example, the hydrogen atom concentration of the dielectric film 8 is about $1.49 \times 10^{21}$ atoms/cm$^3$ or greater. Accordingly, variations of the frequency may be more significantly reduced or prevented.

In the second preferred embodiment, the high-acoustic-velocity material layer is the high-acoustic-velocity film 4. Similar to the second modification of the first preferred embodiment, the high-acoustic-velocity material layer may be the high-acoustic-velocity supporting substrate 24.

The acoustic wave device of each of the above-described preferred embodiments may be used as a duplexer of an RF front-end circuit. This example will be described hereinafter.

Figure 6:
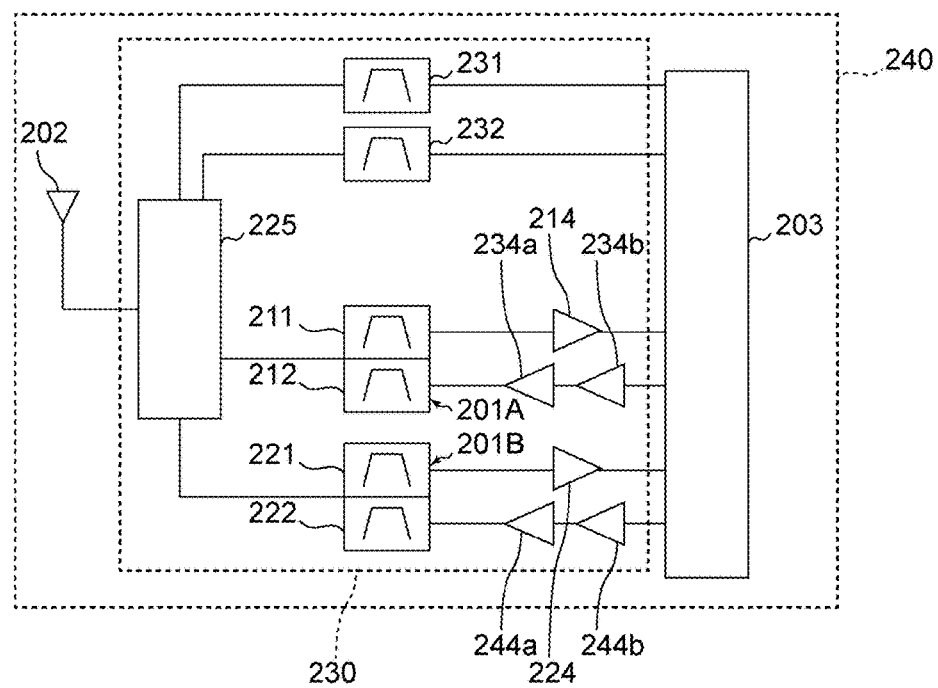
FIG. 6 is a diagram showing a communication apparatus including an RF front-end circuit.

FIG. 6 is a diagram showing a communication apparatus and an RF front-end circuit. Note that elements electrically connected to an RF front-end circuit 230, for example, an antenna element 202 and an RF signal processing circuit (radio frequency integrated circuit (RFIC)) 203, are additionally shown in FIG. 6. The RF front-end circuit 230 and the RF signal processing circuit 203 define a communication apparatus 240. Note that the communication apparatus 240 may include a power source, a central processing unit (CPU), and a display, for example.

The RF front-end circuit 230 includes a switch 225, duplexers 201A and 201B, filters 231 and 232, low-noise amplifier circuits 214 and 224, and power-amplifier circuits 234a, 234b, 244a, and 244b. Note that the RF front-end circuit 230 and the communication apparatus 240 in FIG. 6 are only an example of an RF front-end circuit and a communication apparatus, and are not restricted to the features described above.

The duplexer 201A includes filters 211 and 212. The duplexer 201B includes filters 221 and 222. The duplexers 201A and 201B are electrically connected to the antenna element 202 with the switch 225 provided therebetween. Note that the above-described acoustic wave device may be the duplexers 201A and 201B, and/or may be the filters 211, 212, 221, and 222.

Furthermore, the above-described acoustic wave device is applicable to a multiplexer with three or more filters, for example, a triplexer with three filters having a common antenna terminal, or a hexaplexer with six filters having a common antenna terminal.

That is, the above-described acoustic wave device includes an acoustic wave resonator, a filter, a duplexer, and a multiplexer with three or more filters. The multiplexer is not restricted to a configuration provided with both a transmission filter and a reception filter, and may include only a transmission filter or a reception filter.

The switch 225 preferably includes, for example, a Single Pole Double Throw (SPDT) switch, which electrically connects the antenna element 202 and a signal path corresponding to a certain band in accordance with a control signal from a controller (not shown). Note that the number of signal paths connected to the antenna element 202 is not limited to one, but may be plural. In other words, the RF front-end circuit 230 may correspond to carrier aggregation.

The low-noise amplifier 214 is a reception amplifier circuit that amplifies an RF signal (here, an RF reception signal) having gone through the antenna element 202, the switch 225, and the duplexer 201A, and outputs the amplified signal to the RF signal processing circuit 203. The low-noise amplifier 224 is a reception amplifier circuit that amplifies an RF signal (here, an RF reception signal) having gone through the antenna element 202, the switch 225, and the duplexer 201B, and outputs the amplified signal to the RF signal processing circuit 203.

The power-amplifier circuits 234a and 234b are transmission amplifier circuits that amplify an RF signal (here, an RF transmission signal) output from the RF signal processing circuit 203, and output the amplified signal to the antenna element 202 via the duplexer 201A and the switch 225. The power-amplifier circuits 244a and 244b are transmission amplifier circuits that amplify an RF signal (here, an RF transmission signal) output from the RF signal processing circuit 203, and output the amplified signal to the antenna element 202 via the duplexer 201B and the switch 225.

The RF signal processing circuit 203 performs signal processing on an RF reception signal input from the antenna element 202 via a reception signal path by, for example, down-converting the RF reception signal, and outputs a reception signal generated by the signal processing. In addition, the RF signal processing circuit 203 performs signal processing on an input transmission signal by, for example, up-converting the transmission signal, and outputs an RF transmission signal generated by the signal processing to the power-amplifier circuits 234a, 234b, 244a, and 244b. The RF signal processing circuit 203 is, for example, an RFIC. Note that the communication apparatus may include a baseband integrated circuit (BBIC). In this case, the BBIC performs signal processing on a reception signal processed by the RFIC. In addition, the BBIC performs signal processing on a transmission signal, and outputs the processed transmission signal to the RFIC. A reception signal processed by the BBIC and a transmission signal before being subjected to signal processing by the BBIC are, for example, image signals or audio signals.

Note that the RF front-end circuit 230 may include duplexers according to modifications of the duplexers 201A and 201B, instead of the above-described duplexers 201A and 201B.

In contrast, the filters 231 and 232 of the communication apparatus 240 are electrically connected between the RF signal processing circuit 203 and the switch 225 without having the low-noise amplifier circuits 214 and 224 and the power amplifier circuits 234a, 234b, 244a, and 244b provided therebetween. Similar to the duplexers 201A and 201B, the filters 231 and 232 are electrically connected to the antenna element 202 with the switch 225 provided therebetween.

According to the RF front-end circuit 230 and the communication apparatus 240 with the above-described configuration, the IDT electrode may not be easily damaged, the Q value may be increased, and variations of the frequency may be significantly reduced or prevented by providing an acoustic wave resonator, a filter, a duplexer, or a multiplexer with three or more filters, which is an acoustic wave device of preferred embodiments of the present invention.

Although acoustic wave devices, RF front-end circuits, and communication apparatuses according to preferred embodiments of the present invention have been described by citing the preferred embodiments and their modifications, the present invention includes other preferred embodiments achieved by combining arbitrary elements in the above-described preferred embodiments and modifications, modifications achieved by applying various modifications conceivable to those skilled in the art to the above-described preferred embodiments without departing from the gist of the present invention, and various devices including the RF front-end circuits and the communication apparatuses according to preferred embodiments of the present invention.

The present invention may be widely used in communication devices, for example, cellular phones as an elastic wave resonator, a filter, a duplexer, a multiplexer applicable to a multiband system, a front-end circuit, and a communication apparatus.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
    a high-acoustic-velocity material layer;
    a piezoelectric layer provided directly or indirectly on the high-acoustic-velocity material layer;
    an interdigital transducer (IDT) electrode provided on or above the piezoelectric layer; and
    a dielectric film provided on the piezoelectric layer to cover the IDT electrode; wherein
    an acoustic velocity of bulk waves propagating through the high-acoustic-velocity material layer is higher than an acoustic velocity of acoustic waves propagating through the piezoelectric layer; and
    the dielectric film is made of a material including hydrogen atoms.

2. The acoustic wave device according to claim 1, wherein a hydrogen atom concentration of the dielectric film is greater than or equal to about $1.49 \times 10^{21}$ atoms/cm$^3$.

3. The acoustic wave device according to claim 1, further comprising:
    a low-acoustic-velocity film provided between the high-acoustic-velocity material layer and the piezoelectric layer; wherein
    an acoustic velocity of bulk waves propagating through the low-acoustic-velocity film is lower than an acoustic velocity of bulk waves propagating through the piezoelectric layer.

4. The acoustic wave device according to claim 3,
    wherein the low acoustic-velocity film includes hydrogen atom; and
    a hydrogen atom concentration of the dielectric film is higher than a hydrogen atom concentration of the low-acoustic-velocity film.

5. The acoustic wave device according to claim 3, wherein the low-acoustic-velocity film is made of a material including silicon oxide as a main component.

6. The acoustic wave device according to claim 3, further comprising:
    a supporting substrate; wherein
    the high-acoustic-velocity material layer is a high-acoustic-velocity film provided between the supporting substrate and the low-acoustic-velocity film.

7. The acoustic wave device according to claim 1, wherein the high-acoustic-velocity material layer is a high-acoustic-velocity supporting substrate.

8. The acoustic wave device according to claim 1, wherein the dielectric film is made of a material including silicon oxide as a main component.

9. A radio-frequency (RF) front-end circuit comprising:
    the acoustic wave device according to claim 1; and
    a power amplifier.

10. A communication apparatus comprising:
    the radio-frequency (RF) front-end circuit according to claim 9; and
    an RF signal processing circuit.

11. The acoustic wave device according to claim 1, wherein
    the IDT electrode includes a first busbar connected to a plurality of first electrode fingers and a second busbar connected to a plurality of second electrode fingers; and
    the plurality of first electrode fingers are interdigitated with the plurality of second electrode fingers.

12. The acoustic wave device according to claim 1, wherein the IDT electrode is a multi-metal layer defined by a plurality of laminated metal layers.

13. The acoustic wave device according to claim 1, wherein a bonding layer including titanium oxide is provided in the low-acoustic-velocity film.

14. The acoustic wave device according to claim 1, wherein a pair of reflectors are provided at two sides in an acoustic wave propagating direction of the IDT electrode on the piezoelectric substrate.

* * * * *